(12) United States Patent
Boyd, Jr. et al.

(10) Patent No.: US 10,347,522 B2
(45) Date of Patent: Jul. 9, 2019

(54) METHOD TO REMOVE RESIDUAL CHARGE ON A ELECTROSTATIC CHUCK DURING THE DE-CHUCKING STEP

(71) Applicant: Applied Materials, Inc., Santa Clara, CA (US)

(72) Inventors: Wendell Glen Boyd, Jr., Morgan Hill, CA (US); Tom K. Cho, Los Altos, CA (US); Robert T. Hirahara, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 183 days.

(21) Appl. No.: 15/458,666

(22) Filed: Mar. 14, 2017

(65) Prior Publication Data

US 2017/0263487 A1    Sep. 14, 2017

Related U.S. Application Data

(60) Provisional application No. 62/307,938, filed on Mar. 14, 2016, provisional application No. 62/438,258, filed on Dec. 22, 2016.

(51) Int. Cl.
| | |
|---|---|
| *H01L 21/683* | (2006.01) |
| *H01L 21/687* | (2006.01) |
| *H01J 37/32* | (2006.01) |

(52) U.S. Cl.
CPC .... *H01L 21/6833* (2013.01); *H01J 37/32532* (2013.01); *H01J 37/32706* (2013.01); *H01L 21/68742* (2013.01)

(58) Field of Classification Search
CPC ............. H01L 21/6833; H01L 21/6831; H01L 21/37109

USPC ........................................................ 361/234

See application file for complete search history.

(56) References Cited

U.S. PATENT DOCUMENTS

| | | | |
|---|---|---|---|
| 6,481,886 B1 | 11/2002 | Narendrnath et al. | |
| 2002/0000521 A1 | 1/2002 | Brown | |
| 2015/0138687 A1 | 5/2015 | Boyd, Jr. et al. | |

FOREIGN PATENT DOCUMENTS

| | | |
|---|---|---|
| JP | 2013074251 A | 4/2013 |
| WO | 2016007462 A1 | 1/2016 |

OTHER PUBLICATIONS

International Search Report and Written Opinion from PCT/US2017/018163 dated May 29, 2017.

*Primary Examiner* — Dharti H Patel
(74) *Attorney, Agent, or Firm* — Patterson + Sheridan, LLP

(57) ABSTRACT

A method and apparatus for discharging a residual charge from a substrate support. In one example, a substrate support is provided that includes a body, an electrode disposed in the body, a radiation emitter and a diffuser. The body has one or more holes formed in a workpiece support surface, the workpiece support surface configured to accept a substrate thereon. The electrode is configured to electrostatically hold a substrate to the workpiece support surface. The radiation emitter is disposed in a first hole of the one or more holes formed in the workpiece support surface. The radiation emitter is configured to emit electromagnetic energy out of the first hole. The diffuser is disposed in first hole over the radiation emitter.

19 Claims, 4 Drawing Sheets

METHOD TO REMOVE RESIDUAL CHARGE ON A ELECTROSTATIC CHUCK DURING THE DE-CHUCKING STEP

CROSS-REFERENCE TO RELATED APPLICATIONS

This application claims benefit of U.S. Provisional Application Ser. No. 62/438,258, filed Dec. 22, 2016, and U.S. Provisional Application Ser. No. 62/307,938, filed Mar. 14, 2016, both of which is incorporated by reference in their entirety.

BACKGROUND

Field

Embodiments of the invention relates to semiconductor wafer processing systems and, more particularly, to a method and apparatus for removing residual charges on an electrostatic chuck used to retain a semiconductor wafer.

Description of the Related Art

In high precision manufacturing, for example semiconductor manufacturing, a substrate may need to be precisely held by a fixture during the manufacturing operations to increase uniform quality and reduce defects. In some manufacturing operations, an electrostatic chuck is used as the fixture to hold the substrate against a supporting structure with an electrostatic force ("clamping force") during one or more manufacturing operations. Although electrostatic chucks vary in design, electrostatic chucks utilize the application of a voltage to one or more electrodes embedded in the chuck so as to induce opposite polarity charges in the substrate and the electrode(s), thus generating an electrostatic clamping force. The electrostatic clamping force pulls the substrate against the chuck, thereby retaining the substrate.

A problem with electrostatic chucks is the difficulty of removing the electric charge from the substrate and the chuck when it is desired to release the substrate from the chuck. One conventional solution is to connect both the electrode and the substrate to ground to allow the charge to drain. Another conventional solution is to reverse the polarity of the DC voltage applied to the electrodes.

A shortcoming of these approaches is that often a residual charge remains on the chuck resulting in some electrostatic force remaining between the substrate and the chuck. Additionally, the remaining electrical charge may accumulate regionally such that the electrostatic force applied to substrate may become uneven across the substrate. The residual electrostatic force may also necessitate the use of a large mechanical force to separate the workpiece from the chuck. Undesirably, the force required to remove the substrate often cracks or otherwise damages the substrate. Even when the substrate is not damaged, the difficulty of mechanically overcoming the residual electrostatic force sometimes causes the substrate to pop off the chuck unpredictably into a position from which it is difficult to retrieve using a substrate transport robot.

The accumulation of the residual charge is also detrimental to chucking of a subsequent substrate. The accumulated charge interferes with the chucking voltage by either being additive (i.e., the accumulated charge has the same polarity as the chucking voltage) or being subtractive (i.e., the accumulated charge has an opposite polarity as the chucking voltage).

In certain ceramic electrostatic chucks, high temperature exposure (e.g., exposure to temperatures greater than 200° C.) may make the material of the chuck more conductive. As such, some of the residual charge will dissipate by conduction through the chuck to the electrodes as long as the chuck is maintained at the high temperature. Additionally, a plasma cleaning step may be performed after wafer processing. Typically, an inert gas, such as argon, is introduced into the chamber containing the electrostatic chuck and ionized into a plasma. The plasma may form a conductive path from the surface of the electrostatic chuck to a grounded chamber component, such as a wall of the chamber. The ions from the plasma bombard the electrostatic chuck surface thereby dislodging the residual charges. The dislodged charges then move through the plasma to the ground. The plasma cleaning step may also include high temperatures to further enhance the dissipation of the residual charges. Unfortunately, the dissipating effect of the high temperature maintenance process (either by direct heating, or plasma processing) is greatly reduced as the chuck cools and is prepared for substrate processing.

Therefore, there is a need for an improved electrostatic chuck.

SUMMARY

Embodiments disclosed herein include method and apparatus which improve the de-chucking of a substrate from an electrostatic chuck. A method and apparatus for discharging a residual charge from a substrate support. In one example, a substrate support is provided that includes a body, an electrode disposed in the body, a radiation emitter and a diffuser. The body has one or more holes formed in a workpiece support surface, the workpiece support surface configured to accept a substrate thereon. The electrode is configured to electrostatically hold a substrate to the workpiece support surface. The radiation emitter is disposed in a first hole of the one or more holes formed in the workpiece support surface. The radiation emitter is configured to emit electromagnetic energy out of the first hole. The diffuser is disposed in first hole over the radiation emitter.

In another example, a processing chamber is provided. The processing chamber includes chamber body having a chamber lid, chamber walls and a chamber bottom. The chamber body encloses a chamber interior volume. The processing chamber additional includes a showerhead and a substrate support disposed in the chamber interior volume. The processing chamber additional includes a radiation emitter disposed in one the showerhead, the lid or substrate support. The radiation emitter is configured to emit electromagnetic energy in a direction that illuminates or is reflected onto a workpiece support surface of the substrate support.

In yet another example, a method for discharging a residual charge on a substrate support is provided. The method includes emitting electromagnetic energy through a workpiece support surface of the substrate support, reflecting the electromagnetic energy onto the workpiece support surface of the substrate support, and increasing the conductivity of the workpiece support surface of the substrate support by exposure to the reflected electromagnetic energy.

BRIEF DESCRIPTION OF THE DRAWINGS

Additional features and advantages will be set forth in the detailed description which follows, and in part will be readily apparent to those skilled in the art from that description or recognized by practicing the embodiments as described herein, including the detailed description which follows, the claims, as well as the appended drawings.

So that the manner in which the above recited features of embodiments of the present invention can be understood in detail, a more particular description of embodiments of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for embodiments of the invention may admit to other equally effective embodiments.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Photoconductivity is an optical and electrical phenomenon in which a material becomes more electrically conductive due to the absorption of electromagnetic energy such as visible light, ultraviolet light, infrared light, or gamma radiation. Electromagnetic energy directed at a substrate support formed from materials which absorb the electromagnetic energy increases the conductivity of the substrate support. The frequency of the electromagnetic energy may be tuned to the materials forming the substrate support for enhanced conductivity. Where there are several materials which absorb radiation of the same wavelength, their absorbance add together and the absorbance is no longer proportional to the concentration of any one component. The frequency of the electromagnetic energy may be tuned to the material of the substrate support to increase the absorption of the electromagnetic energy and thus the conductivity of the substrate support for discharging residual charges present on the substrate support, and thus allowing a substrate to be more freely removed therefrom. For example, electromagnetic energy (such as light) is directed at the substrate support with enough energy to raise the electrons (charge) across the band gap, i.e., the energy difference between the top of the valence band and the bottom of the conduction band in insulators and semiconductors, or to excite the impurities within the band gap. The charge on the substrate support may then dissipate through an electrode embedding in the now conductive material of the substrate support.

Figure 1:
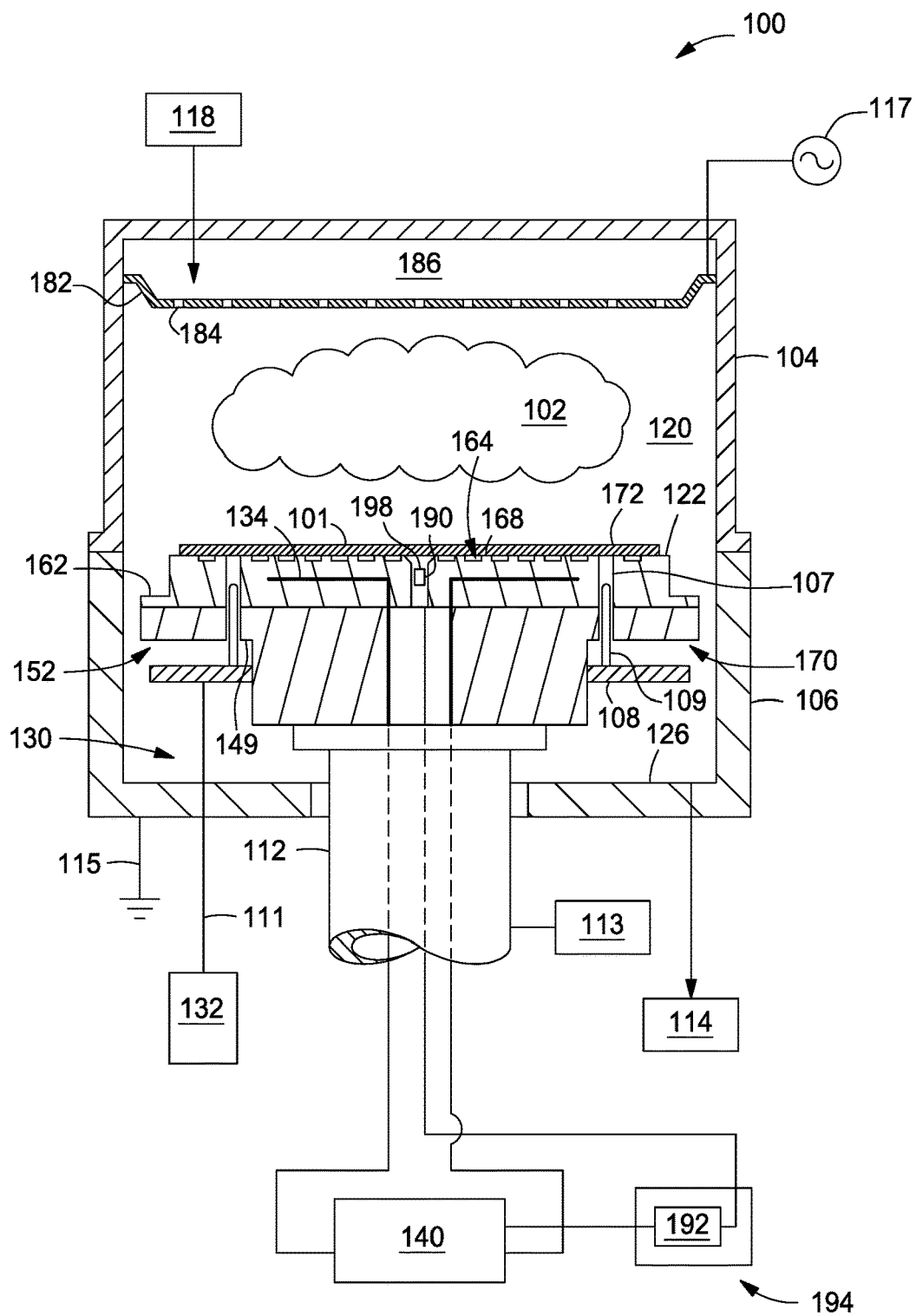
FIG. 1 is a schematic side view of an exemplary processing chamber having a showerhead and a substrate support.

FIG. 1 depicts a schematic view of an exemplary processing chamber 100 having a substrate support assembly 170 installed therein. The processing chamber 100 may optionally have a showerhead 182 installed therein. One or more of the substrate support assembly 170 and or showerhead 182 has a radiation emitter 190 disposed therein. In one embodiment, the processing chamber 100 is a deposition chamber. In another embodiment, the processing chamber 100 is an etch chamber. However, any type of processing chamber, such as physical vapor deposition (i.e., sputtering) chambers, chemical vapor depositional chambers, atomic layer deposition (ALD) chambers or other vacuum processing chambers, may also be used to practice the embodiments disclosed herein.

The processing chamber 100 includes a chamber body 106 having a bottom surface 126 and is covered by a lid 104 which encloses an interior volume 120 of the processing chamber 100. The chamber body 106 and lid 104 may be made of a metal, such as aluminum or other suitable material. The chamber body 106 is coupled to ground 115.

The processing chamber 100 is coupled to and in fluid communication with a vacuum system 114. The vacuum system 114, which includes a throttle valve (not shown) and vacuum pump (not shown), is used to pump down and exhaust the processing chamber 100. The pressure inside the processing chamber 100 may be regulated by adjusting the throttle valve and/or vacuum pump.

A gas supply 118 is coupled to the processing chamber 100. The gas supply 118 provides one or more process gases into the interior volume 120 of the processing chamber 100. In one example, the gas supply 118 may supply one or more process gases into a manifold 186 of the showerhead 182. The showerhead 182 may have a plurality of apertures 184 configured for distributing the process gas from the manifold 186 into the interior volume 120. In one embodiment, the gas supply 118 may supply gases such as argon, oxygen, chlorine, or other gas into the interior volume 120 for processing a substrate 101 disposed therein.

An RF plasma power supply 117 may energize the process gases to maintain a plasma 102 for processing the substrate 101. Optionally, the substrate support assembly 170 may bias the substrate 101 to attract the ions from the plasma 102. Process gases are introduced into the processing chamber 100 from the gas supply 118 and the gas pressure is adjusted to a preset value for plasma ignition.

A control system 194 is coupled to the processing chamber 100. The control system 194 includes a central processing unit (CPU), a memory and support circuits. The control system 194 is utilized to control the processing chamber 100 and the radiation emitter 190 contained therein. The CPU may be of any form of a general purpose computer processor that can be used in an industrial setting. The software routines can be stored in the memory, such as random access memory, read only memory, floppy or hard disk drive, or other form of digital storage. The software routines, when executed by the CPU, transform the CPU into a specific purpose computer (controller) that controls the processing chamber 100 and radiation emitter 190 such that the processes are performed in accordance with the present disclosure. The software routines may also be stored and/or executed by a second controller (not shown) that is located remotely from the processing chamber 100.

As briefly discussed above, the substrate support assembly 170 is disposed in the interior volume 120 of the processing chamber 100. The substrate support assembly 170 has a workpiece support surface 172 upon which a substrate 101 rests during processing. The substrate support assembly 170 may include a vacuum chuck, an electrostatic chuck, a suscepter, a heater, or other substrate support suitable for supporting the substrate 101 within the processing chamber 100 during processing.

In one embodiment, the substrate support assembly 170 includes a substrate support 122 and a support base 152. The support base 152 may include a cooling plate. The support base 152 may also include a cooling plate (not shown). The support base 152 includes a support housing 149 that is coupled to a support shaft 112. The support shaft 112 may be coupled to a lift mechanism 113 which provides vertical movement of the substrate support assembly 170 between an upper, processing position, as shown, and a lower workpiece transfer position (not shown).

The substrate support assembly 170 may include a substrate lift 130 for supporting the substrate 101 above the workpiece support surface 172 during transfer into and out of the processing chamber 100 by a robot (not shown). The substrate lift 130 may include lift pins 109 aligned with a platform 108. The platform 108 is connected to a second lift mechanism 132 by a shaft 111. The substrate support assembly 170 may include through holes 107 configured to receive the lift pins 109. The lift pins 109 may be extended through the substrate support 122 to shape the substrate 101 above the workpiece support surface 172. For example, the second lift mechanism 132 may move the platform 108 in a manner the displaces the lift pins 109 through the through holes 107 and extends the lift pins 109 above the workpiece support surface 172, thus spacing the substrate 101 in a position above the workpiece support surface 172 that facilitates robotic transfer of the substrate 101 to and from the processing chamber 100.

The substrate support 122 has a body 162. The body 162 may be a ceramic puck. The body 162 may additionally include heating elements (not shown). The temperature of the substrate support 122, the cooling plate, and/or other components of the substrate support assembly 170 may be monitored using one or more temperature sensors (not shown), such as thermocouples and the like, coupled to one or more temperature monitors. In one example, the body 162 is coupled to at least one thermocouple for temperature monitoring.

The body 162 may have mesas 168 and recess 164 formed on the workpiece support surface 172 of the body 162. The body 162 may have one or more holes 198 formed in the workpiece support surface 172. The holes 198 may be formed through the body 162, such as backside gas delivery holes, sensor holes, lift pin holes, or other purpose formed holes. The substrate 101 may be supported on the mesas 168 and elevated above the recesses 164.

The body 162 of the substrate support 122 is fabricated of a material that can be excited into a conductive state or a semi-conductive state when exposed to electromagnetic energy, e.g., the material experiences a photoconductive effect. Materials for the substrate support 122 may include ceramic materials, such as aluminum nitride (AlN) or AlN containing dopants such as oxygen or other impurities. The body 162 is coupled electrically to the ground 115.

The body 162 may have one or more electrodes 134 embedded therein for generating the clamping force (Fc). The one or more electrodes 134 may be arranged in a mono polar or bi-polar configuration. The electrodes 134 may be a thin disk or mesh disposed within the body 162. Alternately, the electrodes 134 may each be thin semicircular or "D" shaped plates or any other suitable shape which may operate independently from each other. The electrodes 134 may operate to generate clamping forces in separate zones or areas of the body 162. The electrodes 134 are electrically connected to a chucking power source 140, such as a DC power supply. The electrodes 134 supply the clamping force (Fc) for chucking the substrate 101 to the workpiece support surface 172 of the body 162. The electrodes 134 may be made of any suitable electrically conductive material, such as a metal or metal alloy. Power to the electrodes 134 may be controlled by the control system 194 coupled to the chucking power source 140.

Figure 3:
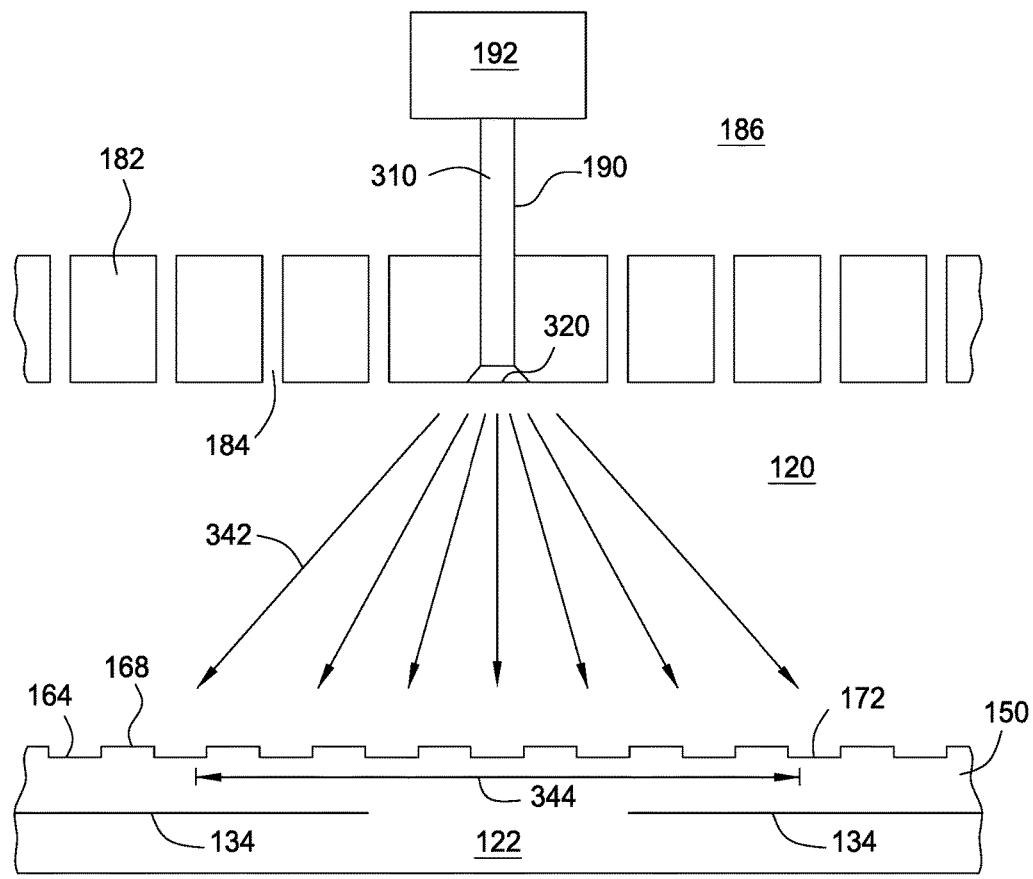
FIG. 3 depicts a portion of the showerhead shown in the processing chamber of FIG. 1, according to a second embodiment.

In one embodiment, the radiation emitter 190 is disposed in the substrate support 122. For example, the radiation emitter 190 may be disposed in the hole 198 formed in the workpiece support surface 172 of the substrate support 122, in a hollow cavity formed in the lift pins 109, or in another suitable location. Alternately, as shown in FIG. 3, the radiation emitter 190 may be disposed in the showerhead 182. The radiation emitter 190 may direct non-ionized radiation (e.g., photons or microwaves) to the workpiece support surface 172 of the substrate support 122 in order to excite certain dopant atoms such as oxygen and cause the material of the substrate support 122 to become semiconductive, i.e., to experience a photoconductive effect. When the substrate support 122 is in a photoconductive state, residual charge present on the substrate support 122, and/or workpiece support surface 172, thus facilitating de-chucking of the substrate 101 from the workpiece support surface 172. The residual charge on the workpiece support surface 172 is discharged into the electrodes 134 or, at a minimum, the residual charge migrates away from the workpiece support surface 172 into the body 162 of the substrate support 122 such that the surface charge density is substantially reduced thereby making de-chucking of the substrate 101 easier. The photoconductive effect may cause the substrate support 122 to become semi-conductive in the areas illuminated by the electromagnetic energy from the radiation emitter 190. In one example, the substrate support 122 may be "pre-conditioned" by the radiation emitter 190 to reduce the charge density prior to operation (e.g., prior to chucking a new substrate). In another example, the substrate support 122 may be illuminated by the radiation emitter 190 to reduce the charge density while de-chucking the substrate 101.

In one example, the radiation emitter 190 directs the electromagnetic energy upwards from workpiece support surface 172 of the substrate support 122 against an object that reflects the energy back against workpiece support surface 172. For example, the radiation emitter 190 may direct and reflect the electromagnetic energy off of the showerhead 182, lid 104, substrate 101 or other object within the processing chamber 100 that can direct the electromagnetic energy back to the workpiece support surface 172 of the substrate support 122. In embodiments wherein the electromagnetic energy is reflected off the substrate 101, the radiation emitter 190 may be operated prior to lowering the substrate 101 onto the workpiece support surface 172 (i.e., prior to processing), while de-chucking the substrate 101 onto the workpiece support surface 172, or after lifting the substrate 101 from the workpiece support surface 172 (i.e., after to processing). In embodiments wherein the electromagnetic energy is reflected off the showerhead 182 or lid 104, the radiation emitter 190 may be operated prior placing transferring the substrate 101 into the processing chamber 100.

Figure 2:
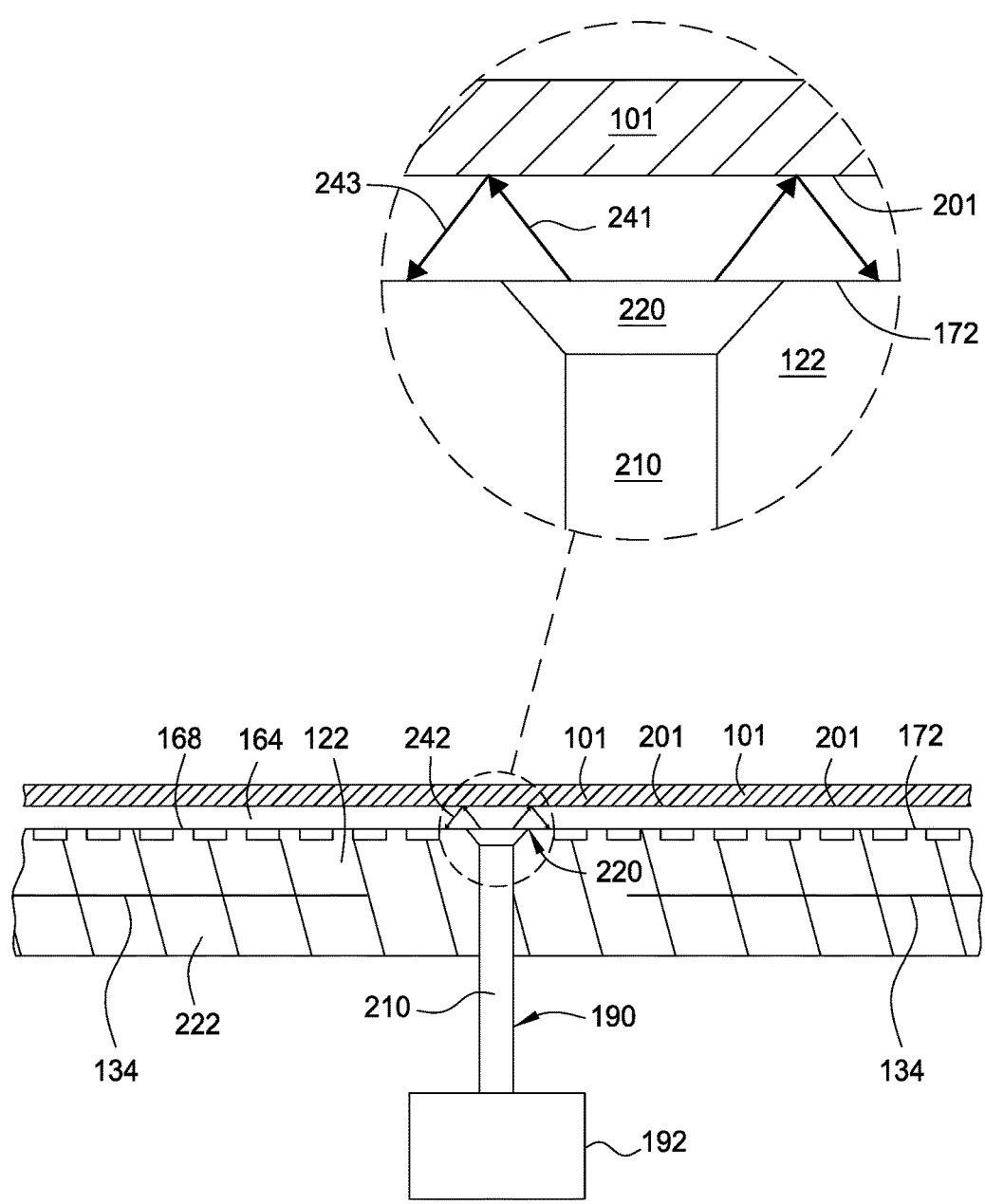
FIG. 2 depicts a portion of the substrate support shown in the processing chamber of FIG. 1, according to a first embodiment.

FIG. 2 depicts a portion of the substrate support assembly 170 shown in the processing chamber 100 of FIG. 1, according to a first embodiment. The substrate support assembly 170 is configured with the radiation emitter 190 for reducing residual charges on the workpiece support surface 172 by photoconductivity. The photoconductive discharge of residual charges can be used in conjunction with any substrate support (i.e., not only an electrostatic chuck) that contains materials that be excited by the photoconductive effect. Such substrate supports include ceramic heaters, pedestals, susceptors, and the like.

The radiation emitter 190 is shown disposed in a portion 222 of the substrate support 122. The radiation emitter 190 may be similarly disposed in other portions of the substrate support 122. In another embodiment, the radiation emitter 190 is attached to the substrate transfer blade. The radiation emitter 190 is coupled to an electromagnetic energy source 192. The energy source 192 may provide electromagnetic energy in the form of visible light, ultraviolet light, infrared light, or even gamma radiation. The radiation emitter 190 may have a conduit 210 for transmitting electromagnetic energy from the energy source 192. The conduit 210 may be a fiber optic cable or other waveguide. The radiation emitter 190 may additionally have a diffuser 220. In one embodiment, the energy source 192 is directly coupled to the diffuser 220. In another embodiment, the energy source 192 is coupled to the diffuser 220 through the conduit 210.

The energy source 192 may produce a continuous spectrum of electromagnetic energy from near gamma rays to extremely low frequency radio waves. The energy source 192 may be a light source such as a lamp, a laser, a magnetron or other source of electromagnetic energy. The energy source 192 may produce electromagnetic energy that operates in a wavelength range from about 10 nm to about 100,000 nm, such as about 700 nm to about 900 nm, for example about 750 nm.

The diffuser 220 may be formed from sapphire, quartz, or other suitable material. The placement of the radiation emitter 190, and particularly the diffuser 220, underneath the substrate 101 during processing operations prevents the diffuser 220 from becoming contaminated with processing byproducts. The diffuser 220 may be formed in the substrate support 122 such as during a printing operation. Alternately, the diffuser 220 may be bonded, welded, press fit, screwed or attached to the substrate support 122 by another suitable method.

In one example, the electromagnetic energy traverses through the diffuser 220 to spread out the electromagnetic energy in waves 242 (shown by the arrows) over a larger area of the substrate support 122. The energy wave 242 may be decomposed into a first wave 241 which contacts a bottom surface 201 of the substrate 101. The angle at which the energy wave 242 contacts the bottom surface may be determined by the diffuser 220 configured to refract the energy wave 242. A second wave 243 is reflected by the substrate 101 back toward the substrate support 122 to impinge the workpiece support surface 172. The second wave 243 may generate a photoconductive effect in the workpiece support surface 172 and increase the conductivity of the workpiece support surface 172 for discharging residual charges therein.

In one example, the radiation emitter 190 is operated prior to chucking the substrate 101, i.e., when the substrate 101 is suspended on the lift pins 109 above the workpiece support surface 172. The electromagnetic energy is spread out by the diffuser 220, which directs the photons over a wider are underneath the bottom surface 201 of the substrate 101. The photons are reflected back to the workpiece support surface 172 by the bottom surface 201 of the substrate 101 and impinge against the workpiece support surface 172 of the substrate support 122 to create a photoconductive state on the workpiece support surface 172. The photoconductive state promotes movement of residual charge away from the workpiece support surface 172 of the substrate support 122, for example, to be conducted away through the electrodes 134 embedded in the substrate support 122. If needed, additional radiation emitters 190 can be added across different regions of the workpiece support surface 172 to increase the number of photons for increasing the excitement of the dopant atoms in the substrate support 122 increasing the conductivity for removing the residual charges therein. Discharging of the residual charges from the workpiece support surface 172 promotes easier de-chucking of the substrate 101 from the workpiece support surface 172, which in turn reduces substrate damage and increase device yield.

FIG. 3 depicts a portion of the showerhead 182 shown in the processing chamber 100 of FIG. 1, according to a second embodiment. The showerhead 182 is configured with the radiation emitter 190 for reducing residual charges on the substrate support assembly 170 by photoconductivity. The radiation emitter 190 is similarly configured as that shown in FIG. 2. The radiation emitter 190 may have an optional diffuser 320 disposed in the showerhead 182. The radiation emitter 190 may additionally have a conduit 310, which as a fiber optic cable or other waveguide. The energy source 192 provides electromagnetic energy 342 through the conduit 310 to the diffuser 320 for delivery to the substrate support 122. In one embodiment, the energy source 192 is directly coupled to the diffuser 320. In another embodiment, the energy source 192 is coupled to the diffuser 320 by the conduit 310.

The diffuser 320 configured similar to the diffuser 220 discussed above, and may be fabricated from sapphire, quartz, or other suitable materials. The diffuser 320 may be formed in the showerhead 182 such as during a printing operation. Alternately, the diffuser 320 may be bonded, welded, press fit, screwed or attached by any suitable method to the showerhead 182. The placement of the diffuser 320 and radiation emitter 190 in the showerhead 182 allows the electromagnetic energy to be directly delivered to the substrate support 122, and minimizes energy loss from reflecting the electromagnetic energy off the bottom surface 201 of the substrate 101 or other object. By locating the radiation emitter 190 in the showerhead 182, a broader area 344 of the substrate support may be targeted with electromagnetic energy from the diffuser 320 compared to embodiments wherein the radiation emitter 190 is disposed in the substrate support 122. In embodiments, where the radiation emitter 190 is disposed in the showerhead 182, the residual charge on the substrate support 122 is removed with electromagnetic energy 342 while the substrate 101 is not present. It is contemplated in embodiments that do not have a showerhead 182, the radiation emitter 190 may be disposed in the lid 104 or other location within the processing chamber 100.

Figure 4:
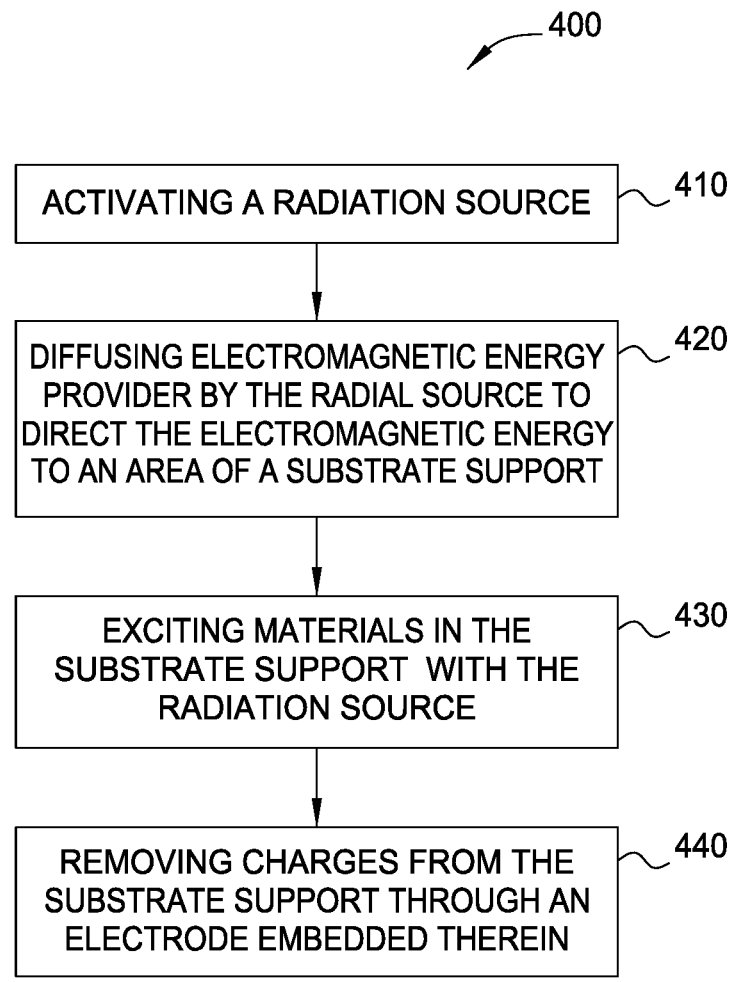
FIG. 4 depicts a flow diagram of one embodiment of a method removing residual charges from a substrate support.

FIG. 4 depicts a flow diagram of one embodiment of a method 400 for removing residual charges on the substrate support. The method 400 begins at a first bock 410 wherein a radiation source is activated to emit electromagnetic energy. The radiation source is coupled to a processing chamber having a substrate support. The processing chamber may additionally have a showerhead. The radiation source may be external to the processing chamber and coupled through a conduit, such as a fiber optic cable. Alternately, the radiation source may be disposed within the processing chamber. For example, the radiation source may be in the substrate support assembly, the lid or showerhead, among other suitable locations. The radiation source may provide electromagnetic energy in a continuous spectrum as discussed earlier. The radiation source may be a light source such as a lamp, a laser, a magnetron or other source of electromagnetic energy. The electromagnetic energy may operate in a wavelength range from about 10 nm to about 100,000 nm, such as about 400 nm to about 1200 nm such as about 700 nm to about 900 nm, for example about 750 nm. The electromagnetic energy frequency range provides an optimal band gap excitation given a specific material and thereby allows optimization of the electromagnetic conductivity phenomenon. In one embodiment, the electromagnetic source is attached to the substrate transfer blade of a robot and provides electromagnetic excitation every time the substrate transfer blade enters the processing chamber.

At a second block 420, the electromagnetic energy is diffused to direct the electromagnetic energy to an area of the substrate support. The electromagnetic energy passes through a diffuser and is spread out over a larger area of the substrate support. In a first embodiment, the diffuser is disposed in the substrate support. In some embodiments, the electromagnetic energy is reflected by the underside of substrate, lid or showerhead back onto the workpiece support surface of the substrate support. In other embodiments, the diffuser is disposed in the showerhead or lid and directly passes energy to the workpiece support surface of the substrate support. In one embodiment, the electromagnetic energy may be supplied while the substrate is not present within the processing chamber. In another embodiment, the electromagnetic energy may be supplied while the substrate is present on either the workpiece support surface or supported thereover on a robot blade or lift pins. The diffuser spreads the electromagnetic energy to accommodate a large surface area of the workpiece support surface.

At a third block 430, the materials for a workpiece support surface of the substrate support are excited by exposure to the electromagnetic energy. During this time, the workpiece support surface experiences a photoconductive effect. The photoconductive effect enables the substrate support to become more conductive and discharge the residual charges therein.

At a fourth block 440, the residual charges are removed through an electrode disposed in the substrate support or to ground. The residual charges in the workpiece support surface pass through the photoconductive body to the electrode embedded therein.

The method 400 may be practiced prior to or after processing each substrate, or may be practiced on a periodic basis (e.g., every Nth substrate) depending upon the amount of residual charge accumulated on the workpiece support surface during each processing cycle.

After chucking and de-chucking many substrates, residual charges build up on the workpiece support surface of the substrate support. The residue charge can lengthen de-chucking times and may lead to breakage or damage of the substrate, poor substrate to robot exchange, and furthermore reduces the service life of the substrate support. Directing the electromagnetic energy (photons) to excite certain dopants within the material of the support surface causes the material to exhibit the photoconductive effect which mitigates the aforementioned defects. The photoconductive state allows any residual charge on the workpiece support surface of the substrate support to be conducted away through the chuck electrodes. The photoconductive state also helps remove surface charges from thin films or contamination left from process byproducts. The removal of the residual charge on the workpiece support surface by the radiation emitter leads to longer life times for the substrate support and a reduction in breakage or damage of substrates processed within the processing chamber.

Advantageously, the radiation emitter may be extended to processing chambers having limited internal space available for additional equipment, such as newer larger substrate processing systems. The radiation emitter, when disposed in the substrate support, is protected from contamination by the substrate positioned thereover, and therefore has a long service interval between maintenance. As the amount of residual electrostatic force is reduced by the radiation emitter, large mechanical forces are not required to separate the substrate from the substrate support as often needed in conventional designs. Thus, cracks or other damages to the substrate are reduced.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A substrate support, comprising:
    a body having one or more holes formed in a workpiece support surface, the workpiece support surface configured to accept a substrate thereon;
    an electrode disposed in the body and configured to electrostatically hold a substrate to the workpiece support surface;
    a radiation emitter disposed in a first hole of the one or more holes formed in the workpiece support surface, the radiation emitter configured to emit electromagnetic energy out of the first hole, wherein the electromagnetic energy is emitted over a continuous spectrum of wavelengths between about 700 nm and about 900 nm, and wherein the emitted electromagnetic energy is operable to increase the conductivity of the workpiece support surface due to the photoconductive effect; and
    a diffuser disposed in first hole over the radiation emitter.

2. The substrate support of claim 1, wherein the body is formed from ceramic.

3. The substrate support of claim 1, wherein the body is formed from AlN or AlN doped with oxygen.

4. The substrate support of claim 1, wherein the radiation emitter is disposed in a lift pin.

5. The substrate support of claim 1 further comprising:
    an electromagnetic energy source coupled to the radiation emitter, wherein the electromagnetic energy source is configure to generate electromagnetic energy having the continuous spectrum of wavelengths between about 700 nm and about 900 nm.

6. The substrate support of claim 1, further comprising:
    a second electrode.

7. The substrate support of claim 1, wherein the first hole is a backside gas delivery hole.

8. A processing chamber, comprising:
a chamber body having a chamber lid, chamber walls and a chamber bottom wherein the chamber body encloses a chamber interior volume;
a showerhead disposed in the chamber interior volume;
a substrate support disposed in the chamber interior volume; and
a radiation emitter disposed in one the showerhead, the lid or substrate support, the radiation emitter configured to emit electromagnetic energy in a direction that illuminates or is reflected onto a workpiece support surface of the substrate support, wherein the electromagnetic energy is emitted over a continuous spectrum of wavelengths between about 700 nm and about 900 nm, and wherein the emitted electromagnetic energy is operable to increase the conductivity of the workpiece support surface due to the photoconductive effect.

9. The processing chamber of claim 8 further comprising:
a diffuser disposed over the radiation emitter.

10. The processing chamber of claim 8, wherein the substrate support is formed from a ceramic material.

11. The processing chamber of claim 10 further comprising:
an electromagnetic energy source coupled to the radiation emitter, wherein the electromagnetic energy source is configured to generate electromagnetic energy having the continuous spectrum of wavelengths between about 700 nm and about 900 nm.

12. The processing chamber of claim 8, wherein the radiation emitter is disposed in a lift pin disposed in the substrate support.

13. The processing chamber of claim 8, wherein the radiation emitter is disposed in a backside delivery hole disposed in the substrate support.

14. A method for discharging a residual charge on a substrate support, comprising:
emitting electromagnetic energy through a workpiece support surface of the substrate support, wherein the electromagnetic energy is emitted over a continuous spectrum of wavelengths between about 700 nm and about 900 nm;
reflecting the electromagnetic energy onto the workpiece support surface of the substrate support; and
increasing the conductivity of the workpiece support surface of the substrate support due to the photoconductive effect by exposure to the reflected electromagnetic energy.

15. The method of claim 14, wherein reflecting the electromagnetic energy comprises:
reflecting the electromagnetic energy off a substrate supported above the substrate support.

16. The method of claim 14, wherein reflecting the electromagnetic energy comprises:
reflecting the electromagnetic energy off a lid or a showerhead disposed above the substrate support.

17. The method of claim 14, wherein emitting electromagnetic energy through the workpiece support surface of the substrate support further comprises:
emitting electromagnetic energy from a plurality of locations.

18. The method of claim 14, wherein emitting electromagnetic energy through the workpiece support surface of the substrate support further comprises:
emitting electromagnetic energy having the continuous spectrum of wavelengths between about 700 nm to about 900 nm.

19. The method of claim 14, wherein emitting electromagnetic energy through the workpiece support surface of the substrate support further comprises:
emitting electromagnetic energy while de-chucking the substrate.

* * * * *

UNITED STATES PATENT AND TRADEMARK OFFICE
CERTIFICATE OF CORRECTION

| | | |
|---|---|---|
| PATENT NO. | : 10,347,522 B2 | Page 1 of 1 |
| APPLICATION NO. | : 15/458666 | |
| DATED | : July 9, 2019 | |
| INVENTOR(S) | : Wendell Glen Boyd, Jr. et al. | |

It is certified that error appears in the above-identified patent and that said Letters Patent is hereby corrected as shown below:

In the Specification

In Column 3, Line 64, delete "and or" and insert -- and/or --, therefor.

In Column 4, Line 61, delete "suscepter," and insert -- susceptor, --, therefor.

In Column 5, Line 50, delete "(AIN) or AIN" and insert -- (AlN) or AlN --, therefor.

In Column 6, Line 67, delete "suscepters," and insert -- susceptors, --, therefor.

In the Claims

In Column 10, Line 49, in Claim 1, delete "a diffuser disposed in first hole over the radiation emitter." and insert -- "a diffuser disposed in the first hole over the radiation emitter." --, therefor.

In Column 10, Line 53, in Claim 3, delete "AIN or AIN" and insert -- AlN or AlN --, therefor.

Signed and Sealed this
Third Day of September, 2019

Andrei Iancu
*Director of the United States Patent and Trademark Office*